(12) United States Patent
Gorka (10) Patent No.: US 7,071,700 B2
(45) Date of Patent: Jul. 4, 2006

(54) CHARACTERIZING ANALOG AND DIGITAL TELEPHONE CIRCUITS AND OTHER TYPES OF WIRING SYSTEMS USING FREQUENCY DOMAIN REFLECTOMETRY (FDR)

(75) Inventor: Timothy F. Gorka, Eagan, MN (US)

(73) Assignee: Wire Eye Co., Okemos, MI (US)

( * ) Notice: Subject to any disclaimer, the term of this patent is extended or adjusted under 35 U.S.C. 154(b) by 0 days.

(21) Appl. No.: 11/128,005

(22) Filed: May 12, 2005

(65) Prior Publication Data
US 2005/0264297 A1   Dec. 1, 2005

Related U.S. Application Data

(63) Continuation of application No. PCT/US03/035923, filed on Nov. 12, 2003.

(60) Provisional application No. 60/425,262, filed on Nov. 12, 2002.

(51) Int. Cl.
G01R 31/11 (2006.01)
G01R 27/32 (2006.01)
H04M 1/24 (2006.01)

(52) U.S. Cl. ............... 324/534; 324/645; 379/27.03
(58) Field of Classification Search ............ 324/534, 324/645, 76.21, 76.19, 76.26, 642, 644; 379/22.03, 379/30, 22.02, 22.04, 26.02, 27.03
See application file for complete search history.

(56) References Cited

U.S. PATENT DOCUMENTS

| | | | | |
|---|---|---|---|---|
| 4,229,626 A * | 10/1980 | Peoples | | 324/605 |
| 4,630,228 A | 12/1986 | Tarczy-Hornoch et al. | . | 364/576 |
| 4,634,813 A | 1/1987 | Hensley | | 379/6 |
| 5,994,905 A * | 11/1999 | Franchville | | 324/533 |
| 6,177,801 B1 * | 1/2001 | Chong | | 324/520 |
| 6,477,238 B1 * | 11/2002 | Schneider et al. | | 379/22.04 |
| 6,507,199 B1 * | 1/2003 | Ahrndt et al. | | 324/533 |
| 6,538,451 B1 * | 3/2003 | Galli et al. | | 324/533 |
| 6,566,889 B1 * | 5/2003 | Warke | | 702/59 |

OTHER PUBLICATIONS

International Search Report; Mar. 19, 2004 (1 Page).

* cited by examiner

Primary Examiner—Anjan Deb
(74) Attorney, Agent, or Firm—Michael de Angeli

(57) ABSTRACT

The structural and termination characteristics of a telephone or other wiring circuit can be determined by generating a continuous stream of low-energy electrical signals, injecting these into the circuit under test, and analyzing the energy reflected at impedance changes in the frequency domain. Standing waves occurring in the circuit can be identified as a function of frequency and analyzed to locate the impedance discontinuities. An unambiguous numerical representation of the circuit can be generated and used to categorically determine if two circuits are indeed alike, or whether the structural and termination characteristics of a particular circuit has remained the same or changed over time. Waveforms are employed that are not sensed by circuits that carry digital telephone traffic, so that the invention is useful in characterizing and providing security protection for those type of circuits in situ.

52 Claims, 3 Drawing Sheets

FIG. 2

CHARACTERIZING ANALOG AND DIGITAL TELEPHONE CIRCUITS AND OTHER TYPES OF WIRING SYSTEMS USING FREQUENCY DOMAIN REFLECTOMETRY (FDR)

PRIOR APPLICATION

This application is a continuation of International Patent Application No. PCT/US03/035923 filed Nov. 12, 2003 which designates the United States and claims priority under 35 U.S.C. §119(e) of U.S. Provisional Patent Application Ser. No. 60/425,262 filed Nov. 12, 2002.

FIELD OF THE INVENTION

This application relates to methods and apparatus for analysis and characterization of telephone circuits and other types of wiring circuits, in order to identify key characteristics of the circuit's construction and provisioning, i.e., connection of active devices. The equipment for circuit characterization described herein is capable of generating both graphic and numeric representations of the circuit. The graphic representation, typically displayed on a screen or charted on a printer, can be used to reveal conditions such as the length of the circuit, the presence of extraneous wires (e.g., bridge taps) on the circuit, equipment in the circuit such as load coils, crossed connections, faults such as water intrusion, bad terminations, or other conditions, while the numeric representation gives the analyst a tool to quickly and unambiguously ascertain whether a circuit's configuration has changed over time, or to determine whether circuits that should be identical are in fact so.

This invention can be used in the fields of: telephony, as a device that performs telephone circuit analysis, and for assuring users that their telephone circuits have not been degraded, tampered with, or taken out of service; security, as a means of identifying conditions or 'signatures' on telephone and other wiring circuits that are characteristic of wiretaps; construction, for electronically verifying and recording the characteristics of newly installed telephone and local area network wiring in buildings and other wiring plants; manufacturing, for performing pre-installation quality assurance testing of manufactured wire harnesses; maintenance, for example, for identifying bad splices, terminations and chafed wires in the wiring harnesses of motorized land vehicles and aircraft; and the cable television (CATV) industry, for precisely locating cable breaks. In particular, because there is enormous waste incurred in digging up a buried CATV cable thought to be faulty, only to find that the fault is not within the section of the cable that was dug up, this apparatus is of value to the CATV technician as well as to telephone technicians.

BACKGROUND OF THE INVENTION

There have been numerous attempts to provide instruments for characterizing telephone circuits so as to describe the structure and provisioning of a circuit.

Characterizing the structure and termination characteristics of a telephone wiring circuit are of primary importance to the diagnostic technician, since it is these properties that are often responsible for problems on a circuit. A poorly terminated circuit, a circuit with extraneous wiring, a circuit with grounded or broken wires, or a circuit that loses too much signal because it is too long are all identifiable by understanding the circuit's structure.

Prior to the apparatus described herein, a device known as the Time Domain Reflectometer (TDR), such as the Tektronix Corporation Model 1503, has come closest to achieving the desired goal of telephone circuit characterization. A TDR works by injecting a high amplitude electrical pulse into the wiring of a telephone circuit. An electrical phenomenon called reflectivity results in a portion of the original pulse being reflected back toward the source of the pulse wherever the impedance of the circuit changes, such as at a junction. As the pulse propagates down the line and eventually reaches and reflects from the end(s) of the wire, the returned reflections can be captured and plotted as a graphical trace. A trained and experienced technician can analyze the curves of the graphical trace to determine many of the circuit's characteristics.

In addition, practitioners in the art of Technical Surveillance and Countermeasures (TSCM) have chosen TDR as the preferred analysis device for identifying conditions in wiring that might represent wiretaps. That is, TDR is used to detect changes in the circuit impedance; these are compared to the presumed circuit structure to locate additional changes in impedance possibly due to wiretaps or the like.

The apparatus and methodology described herein uses Frequency Domain Reflectometry (FDR) (also referred to as Standing Wave Reflectometry (SWR)) to characterize the structure and provisioning of a circuit in a manner that significantly outperforms TDR. As opposed to the discrete pulses transmitted in TDR, FDR utilizes a continuous waveform (i.e. a series of pulses forming, for instance, a square wave, a simple or complex sinusoidal signal, or a "sawtooth" signal comprising a series of triangular pulses) to transmit electrical energy into the circuit under test. As in TDR, the signal is reflected at points in the circuit at which the impedance changes, and the reflections are analyzed to determine the structure of the circuit. The continuous signals employed in FDR are generally of much lower amplitude than that of the discrete pulses used in TDR, resulting in less chance of damage to sensitive electronics than is risked with TDR.

The significance of being able to use both waveforms comprising continuous streams of pulses and non-pulse waveforms (i.e., sinusoids) in FDR is that certain waveforms cannot be used to analyze circuits that are already carrying certain types of signal without interference. Specifically, digital telephone circuits that cannot be analyzed using TDR can now be characterized in situ, that is, while active, using FDR with the appropriate choice of waveform.

Furthermore, the ability of FDR to use multiple low amplitude waveforms allows the apparatus of the invention to be used for long-term security monitoring. These attributes permit characterization signals to be transmitted and monitored continuously without negatively affecting the equipment being protected, and without alerting users and/or perpetrators that protection is active. Accordingly the circuit can be monitored continuously, even during use. Prior art apparatus does not allow users of digital telephones, for example, to be assured that they are not being monitored.

The telephone industry segment that installs and maintains Digital Subscriber Link (DSL) circuits for Internet access has had great difficulty finding circuits of sufficient quality (no bridge taps over a certain length, no load coils, low signal loss) for conversion to DSL during initial installation, or as replacements during operations. The apparatus described herein can be used to initially characterize available circuits to determine if they are qualified for effective DSL communications, and for in situ characterization during normal operations.

Although there are several industrial devices that use FDR/SWR to test optical cables and coaxial cable in antenna systems, e.g., the Model LST-1700 sold by Acterna, of Germantown, Md., the literature and prior art known to the inventor does not describe the use of FDR as a characterizing methodology for telephone circuits.

There is no prior art documents or products known to the inventor that disclose apparatus or methods for characterizing active digital telephone circuits, nor for protecting active digital telephone circuits against wiretaps and eavesdropping.

Pending U.S. patent application Ser. No. 10/134,726 filed Apr. 30, 2002, by Vasquez and the present inventor, called "Characterization of Telephone Circuits" (the "'726 application"), from which priority is not being claimed hereunder, uses a primitive statistical sampling technique of a small portion of an FDR trace to calculate a characteristic number, referred to therein as the Vasquez number. (At the time of the '726 application, it was understood that the device operated on some sort of reflectometry principle, but it was not understood that the reflectometry principle was FDR, and thus FDR was not referred to as such in the '726 patent application.) The characteristic Vasquez number is defined in the '726 application as a unitless number. The Vasquez number thus presented has no practical component that could be used to indicate the nature of the differences between two circuits being compared, such as what is different between them, or the distance between the source of the stimulus and the reflecting impedance change.

Additionally, there are certain conditions where ambiguity in readings provided by the instrument described in the '726 application is a significant possibility, such that two distinctly different circuits can generate the same Vasquez number, leading a technician into a false sense of security.

Thus, although the instrument described in the '726 application has utility, further improvements are called for.

OBJECTS OF THE INVENTION

The primary object of the invention is to be able to determine from a single location, with the greatest efficacy, and to the greatest extent possible, the structure, integrity, and termination characteristics of a telephone or other type of circuit.

It is a further object of the invention to provide an apparatus and method enabling continuous monitoring of the above circuit properties, so as to permit the detection of eavesdropping and wiretapping efforts on a telephone or other wiring circuit without interfering with its normal functions.

SUMMARY OF THE INVENTION

An electrical principle known as reflectivity provides the basis for the characterization of circuits as performed according to the present invention. "Reflectivity" refers to a phenomenon wherein a change in the impedance of a conductor, such as would occur at a wire junction, causes a portion of an electrical signal (i.e. a pulse) that is introduced onto that conductor to be 'reflected' back toward the source. There are two recognized methods for measuring circuit characteristics using the phenomenon of reflectivity, time domain reflectometry and frequency domain reflectometry. Instruments implementing these principles are known as Time Domain Reflectometers (TDRs) or Frequency Domain Reflectometers (FDRs), respectively; an FDR is also known as a Standing Wave Reflectometer (SWR).

While TDR is well-known and implemented in numerous products, FDR, as will be demonstrated, is less well-known but has properties that make it better suited to characterizing telephone circuitry. More specifically, TDR, as the name implies, simply measures the time between injection of a signal into a circuit under test and the time at which the reflected signal is detected; this provides an indication of the distance between the source and the impedance change. FDR, as will be discussed in detail below, is much more sophisticated (hence, of course, its delay in adoption) and capable of yielding much more complete characterization of a circuit under test. Accordingly, the apparatus referred to herein uses FDR for generating reflections and subsequent characterization of a circuit under test.

According to the invention, the characteristics of a circuit can be determined through the analysis of a FDR reflectometer trace. The FDR trace is created by injecting a stimulating waveform of varying frequency content into the circuit under test, then plotting the frequency of the stimulating waveform against the RMS or peak-peak voltage in the circuit, as measured at the stimulating instrument. When the frequency is swept, for example, from a lower frequency to a higher frequency, or vice versa, there will be a series of peaks in the trace of the measured voltage that indicate the frequencies at which standing waves are occurring. (Of course, this assumes that the frequency range that is swept includes those frequencies at which reflections will be generated.)

As mentioned, the peaks in the trace of the measured voltage indicate the frequencies where standing waves are occurring. Standing waves occur where the peak of an outgoing stimulating wave overlaps with the peak of an incoming reflection from a previous wave. More specifically, standing waves occur when the inter-peak-timing of the outgoing waveform is precisely a integer multiple of the time that it takes a previous wave's energy to reach, then reflect from, some reflection point in the circuit, so that successive peaks in the waveform coincide with one another at the same point along the circuit, interfering constructively with one another.

Since the timing of peaks of outgoing waves is a function of the frequency of the waveform, and time and distance are directly proportional, the frequency of the signals resulting in peaks shown on the voltage trace can also be converted directly into a measurement of the distance between the source and the impedance mismatch at which reflection occurs.

The apparatus described herein senses standing waves by measuring the RMS voltage and/or peak-peak alternating current voltage at the source of the stimulus as a range of frequencies are applied to the circuit; again, when the frequency is such that standing waves occur, a peak is detected in the measured voltage, allowing determination of the length of the circuit between the source and the reflector, as discussed in detail below.

Reflections are electrical phenomena that occur when a pulse (or waveform) traveling through a conductor encounters a change in impedance due to junction(s) and/or endpoint(s), in which a portion of the pulse's original energy is reflected back to the point of origin of the pulse, with some loss of amplitude and distortion of the pulse shape. As noted, in TDR, pulses per se are transmitted into the circuit to be characterized; this may occasionally also be performed by the instrument according to the invention, but more commonly FDR will be employed. In FDR, the stimulating waveform can be a continuous train of digital pulses, a continuous simple or complex sine wave, or another continuous waveform such as sawtooth or triangular. The industry refers to generation of a continuous train, or stream, of pulses as Pulse Width Modulation (PWM); the number of pulses per second is the frequency of the signal, measured in hertz. A 100 Kilohertz PWM signal would be a continuous stream of square or rectangular pulses generated at the rate of 100,000 pulses per second. A requirement of PWM is that the timing between pulses be uniform.

A pulse is an electrical stimulus that rapidly raises the voltage level at the physical location where the test points make contact with the circuit. In less than a nanosecond (typically), voltage increases from a relaxed state (usually 0 volts) to an excited state (e.g. +5 volts DC.) The width of the pulse determines how long the voltage is held at the excited 'high' state. The 'high' voltage pulse propagates through the circuit much like an ocean wave, but at nearly the speed of light. When the wave front of the pulse encounters a change in impedance (due to a junction) or reaches the endpoint of a wire, a reflection occurs, and a portion of the pulse is reflected, so as to travel back toward the source, albeit with some distortion of its shape and some loss of amplitude. At the end of the pulse period, the voltage level is again rapidly returned to the relaxed state (usually 0 volts.)

Where a series of pulses is transmitted as a continuous PWM signal, the value for the "inter-pulse-timing" can be measured between the leading edges of two successive pulses and, at any frequency, is represented by the formula Inter-pulse-timing=1/frequency where inter-pulse-timing is in seconds and frequency is in hertz. A similar determination can be made for successive "crests" in a sine wave, for successive triangular peaks in a sawtooth wave, and the like.

Specifically, suppose a standing wave was detected in a particular circuit in response to a continuous excitation signal at a frequency of 280810 hertz. According to the above formula, the inter-pulse-timing would be 0.0000035611267 seconds, or 3.5611267 microseconds. Signals propagate down wires at approximately 0.5 to 0.8 times the speed of light, depending on the media; the precise speed in the usual media is well-known. If the media in the example were such that pulses were to exhibit a velocity of propagation of $7.45 \times 10^8$ feet/second, the pulses can be determined to have traveled 0.0000035611267 seconds times $7.45 \times 10^8$ feet per second; that is, this indicates that the total travel of the pulse from the source to the reflection point and back to the source is 2653 feet, which means that the reflection point is ½ that distance or 1326.5 feet away from the source. If the frequency of the standing wave were just 100 hertz different, e.g. 280910, then the inter-pulse-timing would be 0.0000035598590 seconds or 3.5598590 microseconds, for a round-trip distance of 2652 feet and a stimulus-to-reflection-point distance of 1326.0 feet. Measurement of the frequency at which standing waves occur therefore provides a very accurate measure of distance at any known velocity of propagation.

We can then apply the following formula to determine the distance of the reflector from the pulse transmission source.

Distance from source=(velocity of propagation*inter-pulse-timing)/2

Directly translating frequency to distance therefore becomes

Distance from source=(velocity of propagation/frequency)/2

Where the units of length for distance from source and units of distance traveled over a time period (velocity of propagation) of the signal are identical (e.g. feet and feet per second). This is the basic formula for frequency domain reflectometry (FDR).

FDR standing waves can be observed and measured by stimulating the circuit with a number of different waveforms. Various waveforms can be used to characterize the circuit to extract more information from a sweep. A sweep is a series of tests wherein the stimulating frequencies are monotonically varied from some low frequency value to some higher frequency value or vice versa.

As indicated above, FDR can be performed using a continuous stream of discrete pulses, or by continuous sine or sawtooth waves. For the present discussion, we focus on FDR using PWM, which defines a continuous stream of pulses, i.e., square-edged pulses of energy transmitted at regular intervals, so as to define a frequency and thus an effective wavelength. A PWM signal can be defined using either a fixed pulse width value or a fixed duty cycle value (i.e. 40%).

The following definitions are in accordance with the usual usage in the art. As above, a pulse is an electrical stimulus that instantaneously raises the voltage level at the physical location where the test points make contact with the circuit. In less than a nanosecond (typically), voltage rises from a relaxed state (usually 0 volts) to an excited state (e.g. +5 volts DC.) The width of the pulse determines how long the voltage is held at the excited 'high' state. Thus, pulses have two properties: amplitude and width. A corollary to width is duty cycle, represented as a ratio or percentage, so that a 50% duty cycle means the voltage on the signal line is "low" (usually zero) exactly half the time and the "high" value (usually 5 v) the other half of the time.

A 50% duty cycle PWM is thus a true square wave at any frequency. Similarly, if a 100 KHz pulse train has a 25% duty cycle there will be a leading edge of a pulse every 10 microseconds, and the excited state of the pulse will last for 25% of 10 microseconds, or 2.5 microseconds, while the relaxed state of the pulse will be 7.5 microseconds.

Specifically, the calculation of duty cycle is:

DutyCycle %=(duration of 'high' state of pulse/total duration of pulse)*100

One of the features of FDR using a waveform comprising a series of pulses versus the discrete pulses of TDR is that FDR characterization of the circuit can be accomplished using a much lower pulse amplitude than with TDR. Certain implementations of TDR can actually damage some electronic equipment. For this reason, a telephone circuit must often be physically disconnected from the electronics at the telephone company's central office (CO) before TDR tests can be performed; this is very inconvenient and in some cases impossible. By comparison, the low amplitude of typical FDR signals permit circuit testing and characterization in situ with no need to deactivate and disconnect circuits from CO equipment.

There are practical limitations to in situ testing using FDR. If a circuit being characterized has a length of 25 miles or more, the stimulating frequencies required will trigger special test modes of the telephone circuitry. More specifically, telephone company equipment will trigger a "loop-back" mode, preventing further transmission, if a frequency of precisely 2713 Hz is detected; this translates to a practical limitation on FDR of 25 miles.

The generation of reflections as needed for FDR is as effective at shorter ranges (to 15,000 ft or less) using simple sinusoidal waveforms as using PWM (a stream of pulses). Longer distances cannot be characterized as effectively by simple sinusoidal waveforms as by square waves, because the leading edge of the sine wave is not reflected as effectively due to its relatively slow rise time. Complex sinusoidal waveforms can be custom generated to provide a fast rise time of the leading edge which will generate the characterizing reflections.

Sinusoidal waveforms interact with incoming reflections to produce complex resultant waveforms. Spectral analysis of these waveforms will prove to be useful in further characterizing the circuit under test, but is not further described in this application. Thus, differing waveforms may be preferred depending on various aspects of the circuit under test.

Variations in pulse width are useful in sensing the length of bridge taps. The bridge tap is a wire pair that intersects the primary run between two points. An extension line in a facility is an example of a bridge tap, while much more significant bridge taps are created to facilitate legal and illegal wiretapping. Bridge taps are of extreme interest in connection with: security, where the presence of a bridge tap is an indicator that someone might be planning or has implemented a wiretap; telephony, where a bridge tap can cause unusual behavior in a circuit; and DSL, where reflections from a bridge tap can actually nullify DSL's digital pulses.

While the TDR referenced above can sense the presence of a bridge tap, it cannot tell the technician much more about them. FDR can not only sense the bridge tap, but is able to characterize the length of the bridge tap as well.

The present inventor has compared two FDR plots of frequency vs RMS voltage using two PWM sweeps with frequencies varying from 80 kilohertz to 800 kilohertz, further employing two different pulse widths, the first sweep using a relatively narrow pulse width of 1 microsecond and the second with a wider pulse width of 2 microseconds. The circuit was 2000 feet long, configured with a bridge tap 60 ft in length at 1000 feet. The standing wave peak that represented the location of the 60 foot bridge tap was shifted on the second trace with respect to the first trace by a distance equivalent of 60 feet. The distance shift is due to (1) a reflection that is wider due to a wider initial pulse and (2) overlap and interaction of the outgoing pulse with 2 reflections, one from the junction of the bridge tap with the main wire run and another from the endpoint of the relatively short bridge tap.

This phenomenon is consistent for other lengths of bridge taps as well, meaning that the lengths of bridge taps can be determined by setting up a relatively narrow pulse and locating the frequency that causes a standing wave at the base of the bridge tap, then increasing the pulse width until the frequency shift of the standing wave is no longer significant. The frequency shift due to the widening of the pulse width is then converted to distance, which becomes the length of the bridge tap. The technique described above works for bridge taps up to 1000 feet in length. Because longer bridge taps create large standing wave harmonics, simple repetitive waveforms such as square waves or simple sinusoidal, sawtooth and triangular waveforms are not useful in determining the length of longer bridge taps; instead, PWM waveforms of varying duty cycle or complex sinusoidal waves are required to characterize these longer bridge taps.

The effects of resistance and impedance at junctions and endpoints will help determine the type(s) of equipment terminating the circuit. More specifically, it was observed that when an electrical resistance is used to terminate an endpoint of a branch on the circuit, the amplitude of the returned reflection from that endpoint is measurably reduced. In any given wiring plant, all unpopulated endpoints of circuits will return the same relative reflection amplitude. It should accordingly be possible to determine if any equipment exists at the endpoints of any branches of a circuit by detecting differences in the amplitude of returned reflections from the 'standard unpopulated endpoint amplitude' of known unpopulated endpoints of that wiring plant. Further, it is possible to determine the types of equipment at a bridge tap junction or endpoint by incrementally altering frequencies (a few hertz) above and below each frequency that produces the peak value for that node. This will require high precision function generation and sensitive measurement components. When the small increments of measurement are analyzed, the result will be a 'signature' for the equipment at that node (if any). The type of equipment that is attached to each endpoint can then be determined by comparison of this 'signature' to a catalog of known signatures.

In practice, the velocity of propagation of signals in telephone circuitry changes due to factors such as temperature variation. Therefore, the frequencies at which standing waves occur may differ between two consecutive characterization readings due to changes in the ambient temperature. This might cause the circuit to be thought to have changed between tests. In FDR, if we calculate a ratio between the frequencies that generate two adjacent standing waves, we can then use the ratios between adjacent standing waves as the ultimate methodology to determine if the structure of a circuit has changed between characterization runs. The velocity of propagation of signal that generate standing waves will all be affected at the same rate by the same phenomena. Accordingly ratiometric measurements carried according to the invention will be unaffected by such variations.

In a graph of voltage versus frequency of the transmitted signal, every uniquely constructed circuit will exhibit a unique pattern of peaks, corresponding to a like number of standing waves, corresponding to a like number of junctions or other causes of variation in impedance. Because each peak on the trace is caused by a standing wave of particular frequency, the set of frequencies that represent peaks on the trace can be used to numerically and unambiguously characterize the circuit. Stated differently, for every circuit thus characterized by a set of standing wave peaks, a set of frequencies, a set of distances of reflectors from a source, or a ratio of the standing wave frequencies relative to each other can be characterized by a single number calculated in one of a variety of ways. Such a numerical representation will be useful in comparing circuits to one another, or in determining if the structure of a circuit has changed over time.

In one example of a method for generating a unique number characterizing a circuit, we determine the location of each standing wave in units of feet measured from the source. In order that the location of each standing wave representing the location of a reflector is represented uniformly by a three digit number, we scale the location of each standing wave such that locations of standing waves below 100 feet are represented in feet; between 100 and 999 feet, in 10 s of feet, rounded to the nearest 10 feet; and 1000 feet and above, in 100 s of feet rounded to the nearest 100 feet, then prefix each 2-digit scaled number with another number that is a function of the scaling factor used for the number. The scaling factor '1' means that the succeeding 2-digit scaled number is multiplied by $10^0$, the prefix '2' means that the succeeding 2-digit scaled number is multiplied by $10^1$, and the prefix '3' means that the succeeding 2-digit scaled number is multiplied by $10^2$. Each standing wave location value thus becomes a triplet (a 3-digit number) that can be directly used to represent the distance of each reflector from the source. By concatenating these triplets in sequence, we can create a number (albeit large) that represents the overall standing wave characteristics of the circuit. This number is referred to hereinafter as the Standing Wave Overall Characterization Number (SWOCN).

The following table, generated with respect to an exemplary circuit exhibiting standing waves at distances of 80, 93, 140, 160, 183, 330, 600, 952, 1500, 3000, and 7500 feet from the source, indicates how the SWOCN can be created using either standing wave triplet values or ratios.

| STANDING WAVE LOCATION | STANDING WAVE TRIPLET VALUE | SWOCN | STANDING WAVE RATIO VALUE |
|---|---|---|---|
| 80 | 180 | 180 | 000080 (first node) |
| 93 | 193 | 180193 | 860 = (80/93)*1000 |
| 140 | 214 | 180193214 | 643 = (90/140)*1000 |
| 160 | 216 | 180193214216 | 875 = (140/160)*1000 |
| 183 | 218 | 180193214216218 | 874 = (160/183)*1000 |
| 330 | 233 | 180193214216218233 | 555 = (183/330)*1000 |
| 600 | 260 | 180193214216218233260 | 550 = (330/600)*1000 |
| 952 | 295 | 180193214216218233260295 | 630 = (600/952)*1000 |
| 1500 | 315 | 180193214216218233260295315 | 635 = (952/1500)*1000 |
| 3000 | 330 | 180193214216218233260295315330 | 500 = (1500/3000)*1000 |
| 7550 | 375 | 180193214216218233260295315330375 | 397 = (3000/7550)*1000 |

A numeric representation of the circuit such as the SWOCN can be used to unambiguously determine whether two circuits have the same physical structure or not. By storing the SWOCN and performing another test at a later time, we can compare SWOCNs to determine if the circuit is unchanged over time. The final SWOCN for the circuit above is 180193214216218233260295315330375. If the SWOCN for a truly identical circuit were generated, or that same circuit, unchanged, were measured at a later time, it too would have the same SWOCN 180193214216218233260295315330375.

If the second circuit, however, exhibited an additional standing wave at 350 feet due to a bridge tap, for instance, then the triplets would be 180, 193, 214, 216, 218, 233, 235, 260, 295, 315, 330, 375, i.e., with an additional "235" added, and the new SWOCN would be 180193214216218233235260295315330375. The triplet 235 added to the first circuit's standing wave overall characterization number would inform a technician that not only was there a difference in the two circuits, but that the difference was 350 feet ($10^1*35=350$) away from the source of the stimulus.

Recognizing that it would be difficult to quickly look at the numbers 180193214216218233235260295315330375 and 180193214216218233260295315330375 to tell if they were different or not, a preferred instrument will incorporate some type of "hash" algorithm, such as that known as MD5 (Message Digest 5) that is used to quickly compute a short number from a computer program file's contents, or some other form of checksum algorithm to create an unique, short, 4-to-6 digit representation of the full SWOCN. This short checksum number is called the Horizontal Characterization Checksum (HOCC) hereinafter.

Whether standing wave node values or standing wave ratios are used in the computation of the overall number, the junctions in question and their distances from the stimulus will have been effectively recorded.

In a further example of a number uniquely characterizing a circuit, the peak voltages on the trace corresponding to the standing waves on the trace are measured and recorded. The voltages at those peaks can be represented as triplets. We can then concatenate the standing waves' voltage triplets to form an overall characterization number for all the voltages at the standing waves. This number is called the Voltage Overall Characterization Number (VOCN).

Similarly to the hashing of the SWOCN to create the HOCC, the VOCN can also be hashed to some easily readable number for ease of comparison. The short checksum number for the VOCN is called the Vertical Characterization Checksum (VeCC) herein.

Another method of generating a unique "signature" of the circuit under test that can be saved and readily compared to a similar measurement made later employs the well-known mathematical technique known as a "Fourier transform", essentially as follows. The result of the test process described above, that is, transmitting energy at stepwise-varying frequencies into the circuit under test, halting the transmission, and measuring the voltage across the circuit, yields a number of data points, of voltage versus frequency. (It will also be recognized by those of skill in the art that this process is equivalent to transmitting a continuous wave of slowly-varying frequency into the circuit and monitoring the circuit's response.) These data points can be plotted, such that peaks in the plot will correspond to resonant frequencies characteristic of the circuit, and the plot can itself be preserved for later use. In a further improvement, Fourier transform analysis can be applied to the plotted data; as is well known, this analytical technique results in a series of coefficients for various frequency components of the input data. These coefficients characterize the resonances of the circuit, and can be analyzed to locate points at which the impedance changes, to locate faults, bridge taps and the like, and may be stored for subsequent comparison to similar data to determine whether any of the circuit's characteristics have changed.

BRIEF DESCRIPTION OF THE DRAWINGS

The invention will be better understood if reference is made to the accompanying drawings, in which.

DESCRIPTION OF THE PREFERRED EMBODIMENTS

Figure 1A:
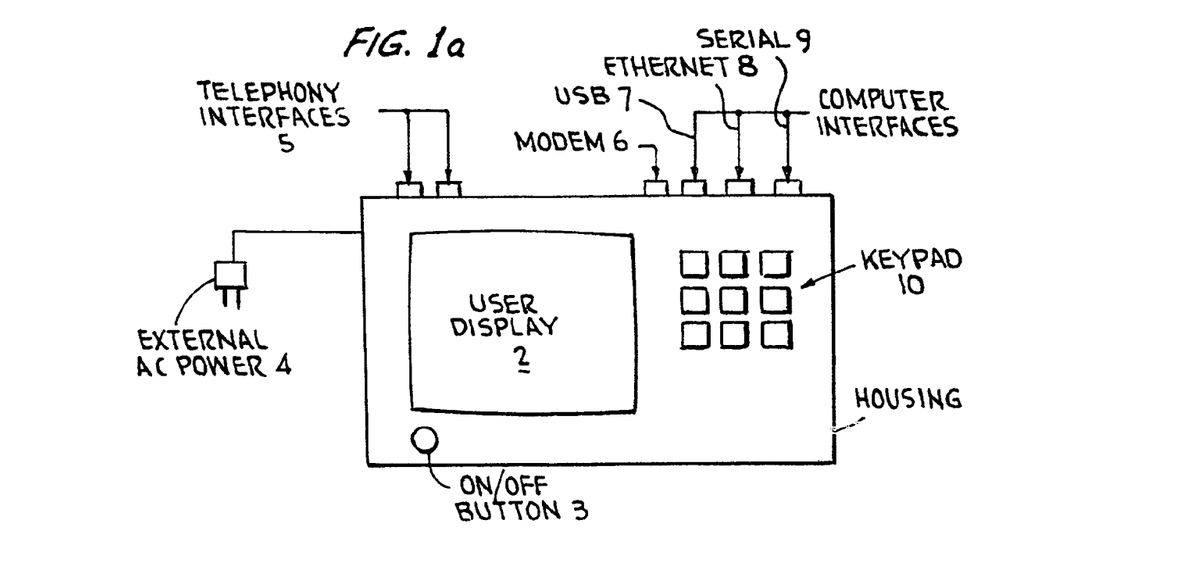
FIG. 1(a) is an external view of an embodiment of the instrument implementing the invention described above, showing user interfaces and external controls.
Figure 1B:
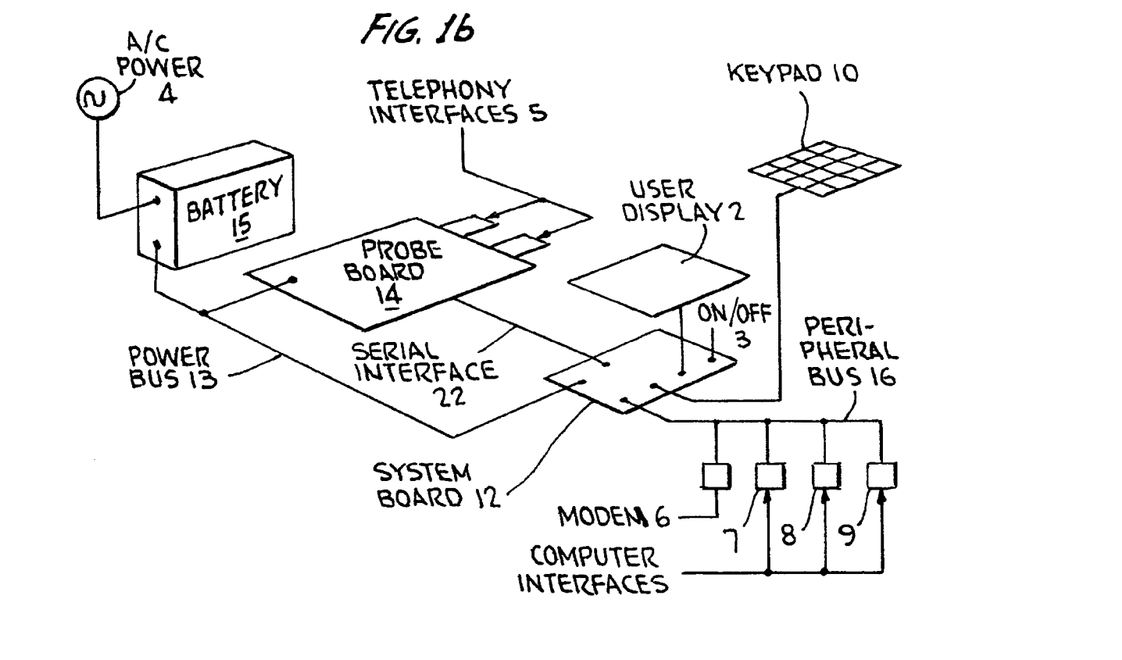
FIG. 1(b) is a block diagram of the major internal components of the same embodiment of an instrument implementing the invention, showing the overall system architecture and illustrating the relationship between the system processor board, the probe board, battery, keyboard, display and external interfaces.

A simplified view of the overall system construction of one preferred embodiment of an instrument implementing the invention is shown in FIG. 1, comprising FIG. 1(a), an external view, and FIG. 1(b), an internal view. In this embodiment, the instrument is a portable battery-operated device that is activated by depressing the power button [3]. An external power pack [4] can be used to both charge the internal battery [15] and to power the unit for long periods of time.

When the power switch [3] is depressed, power flows via the power bus [13] into the system board [12] and the probe board [14]. The system board [12] in turn provides power to the user display [2] and the optional modem [6] and other computer interfaces [7], [8] and [9].

Figure 2:
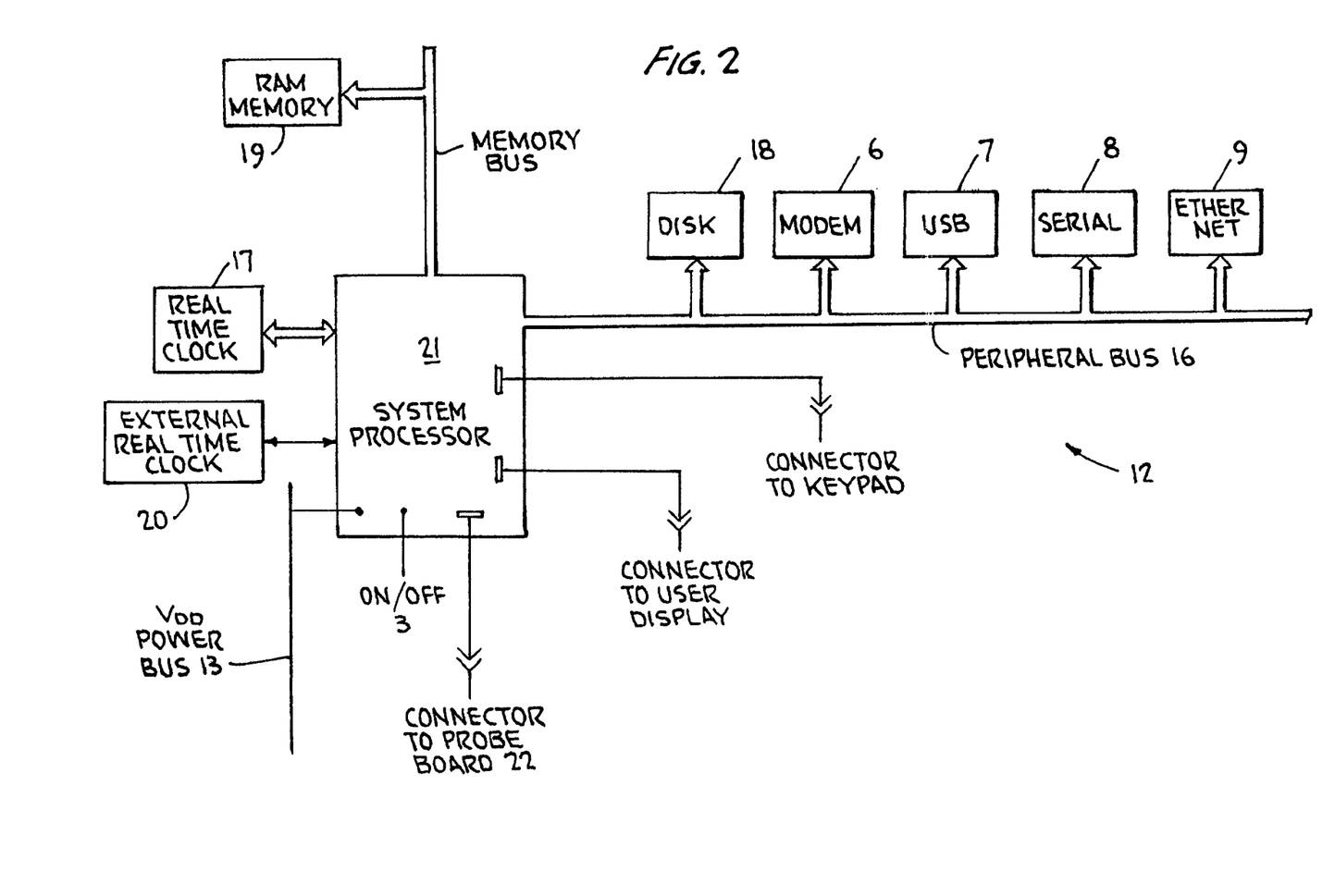
FIG. 2 is a block diagram of the system processor board's architecture showing its relationship with other major system components.

A schematic view of the system board of the same preferred embodiment is shown in FIG. 2.

Power-up initializes the system disk [18]. Factory microcode in the system processor, as is conventional, automatically loads initial system (bootstrap, or boot) code from the system disk. The boot code in turn loads the operating system into, and runs the operating system from, the system processors memory [19].

The mechanics of suitable operating system design, implementation and usage are well described in other literature and well known to those of skill in the art, and as such will not be described herein.

Typical choices for the system processor [21], such as the StrongARM processor from Intel Corporation, do not have the ability to maintain an internal real-time clock [17] when the power is withdrawn from the system board [12]. Therefore, each time the system board is powered up, the system processor [21] will read the clock contents from an external real-time clock [20] to set its own internal real-time clock [17] before continuing.

The system processor [21] then performs self-tests before activating the user display [2], keypad[10], and optional modem [6], optional universal serial bus (USB) interface [7] optional serial interface [8], and optional Ethernet interface [9].

The system processor [21] then instructs the probe processor [30] to perform a series of self-checks and perform a self-calibration with onboard reference electronics [46] (FIG. 3), such as the 1 volt RMS source shown. Self-calibration will enable different field units to generate the same readings for any given circuit.

As mentioned, the system processor [21] can be a microminiature StrongARM system processor from the Intel Corporation that draws power only from the battery pack [15]. The external power source [4], when plugged in, provides enough current to keep the battery pack [15] fully charged. Once activated, the system processor [21] communicates with memory [19] through the memory bus [33] and disk storage [18] through the peripheral bus [16] to load the operating system and programs from the disk [18].

The display [2] is controlled by the system processor [21] via a commercial operating system. The display [2] is the primary method of communicating with the user and provides feedback when the user inputs instructions to the system via the keypad [10].

When the system processor [21] needs to send data to an information provider, it activates the appropriate external interface, such as modem [6], USB [7], serial [8], or Ethernet [9] port, to communicate with the appropriate provider.

The mechanics of modems, USB, serial and Ethernet design, implementation and usage are well described in other literature and well known to those of skill in the art, and as such will not be described herein.

Figure 3:
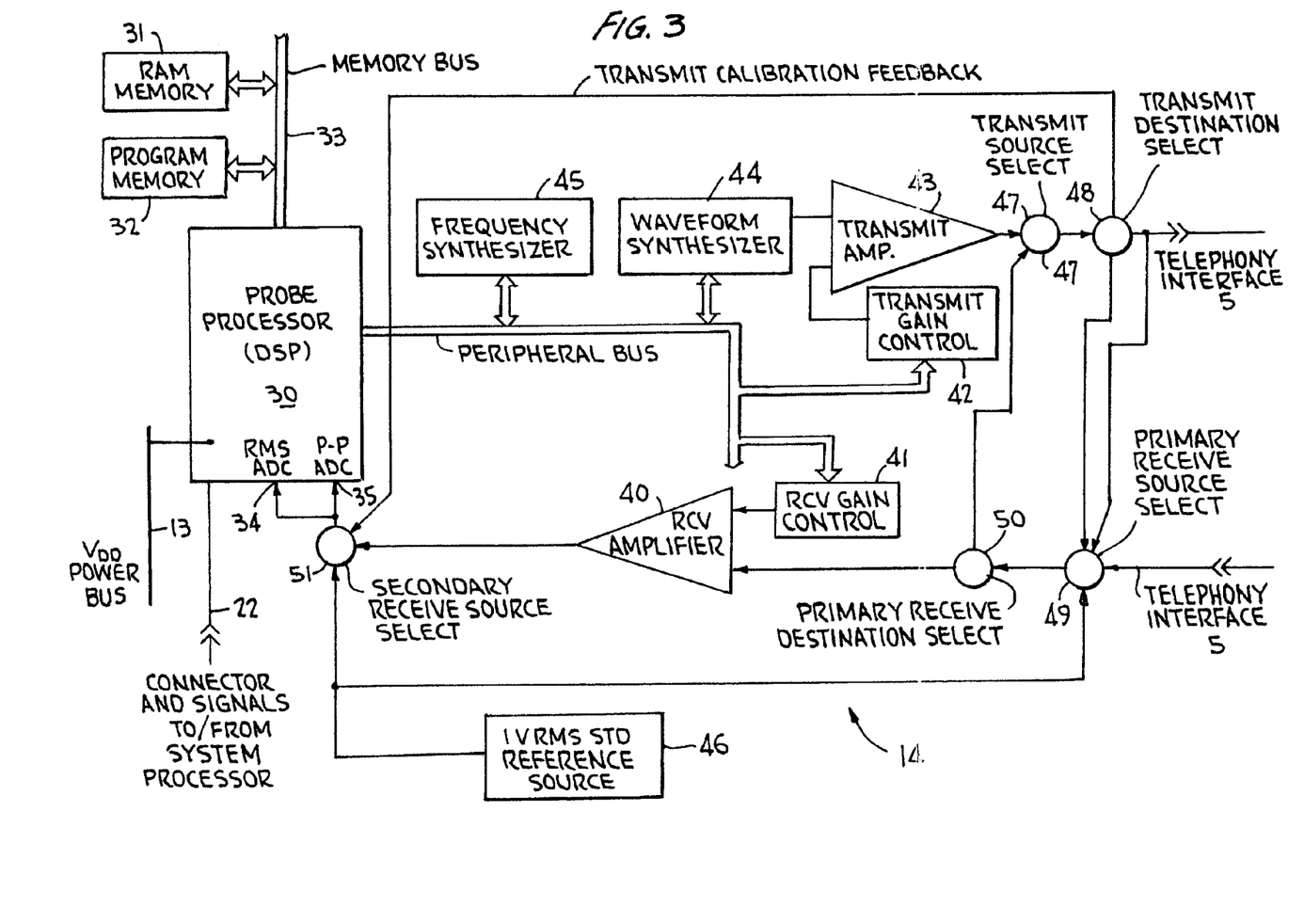
FIG. 3 is a block diagram showing the overall design of a 'probe board', that is, a daughterboard implementation of the circuitry required to accurately generate both the waveform(s) and amplitude(s) of the stimulating energy, and the major circuit components employed to sense the peak-peak and RMS voltages used to create the FDR plot.

Communication between the system processor [21] on the system processor board [12] and probe processor [30] on the probe board [14] is via a standard industrial serial interface [22].

FIG. 3 demonstrates a preferred embodiment of the probe board layout. The probe processor [30] is a class of microprocessor known as a digital signal processor (DSP) such as the TMS320F2812 from the Texas Instruments Corporation which is optimized for the generation, reception and processing of external waveforms and signals. As applied to this embodiment, the frequency synthesizer [45] and waveform synthesizer [44] of the probe board are explicitly shown on the figures but are, in reality, built-in functions of the DSP probe processor [30]. The commands sent to the DSP [30] are generated by the system processor [21] in response to operator inputs; typically the operating system running on the system processor [21] will provide a user interface in the display from which the operator can select options, and the system processor can then generate the appropriate control signals and commands to cause the DSP to generate and transmit the desired signals into the circuit, and to analyze the reflected signals. For example, typically the operator will select a signal amplitude, e.g., 1 v RMS peak, a signal type, such as sine wave, sawtooth, or PWM, a frequency sweep range, e.g. 10 khz–2 Mhz, and, in the case of a PWM signal, a duty cycle. The DSP [30] acknowledges receipt of each of those commands. The commands to and responses from the DSP [30] are sent via the serial interface [22].

Field calibration of the transmitter and receiver stages is key to repeatability in the system. In order to determine whether two circuits are identical or whether a circuit has changed over time, both SWOCN and VOCN or their ratios must be uniformly calculated on different occasions. While the SWOCN will determine the physical layout of the wiring, the VOCN will be help determine the nature of terminating equipment at junctions and endpoints. In order to ensure that a calibration reference is available, a RMS voltage reference source [46] is carried on board, as noted above.

The circuitry of the probe board permits the gain of the transmit amplifier [43] and receive amplifier [40] to be adjusted via the transmit gain control [42] and receive gain control [41], respectively, such that the amplifiers are always calibrated relative to the on-board RMS Voltage reference source [46]. This adjustment process is carried out automatically by the probe processor 30 on each power-up.

The transmit source select switch [47], transmit destination select switch [48], primary receive source select switch [49], primary receive destination select switch [50], and the secondary receive source select switch [51] permit incoming and outgoing signals to be re-routed to various locations on the board. Again, these switches are controlled by the probe processor 30 automatically in response to commands from the system processor 21.

In the embodiment shown, a three stage calibration would be performed in order to maintain the highest accuracy in the system, as well as providing for replicable results between different instruments.

The first stage calibration sequence instructs the secondary receive source select switch [51] to route the reference standard RMS signal source [46] to both the DSP's RMS read ports [34] and the peak-peak read port [35]. This will confirm that the DSP's input ports [34] and [35] are operating correctly.

Second stage calibration instructs the transmit output selector switch [48] to route the output signal from the output amplifier [43] to the secondary receive source select switch [51]. The frequency and waveform synthesizers [45] and [44], respectively, are both instructed to generate the frequency and waveform that are specified for calibration. Once the output amplifier [43] begins to generate amplified signal, the amplified signal will arrive at the DSP's RMS port [34] and peak-peak port [36]. The transmit gain control [42] will then be instructed to set the gain of the transmit amplifier [43] to set the generated signal to a specific calibration amplitude. Once gain is set, it is not altered over any specific set of tests.

Third stage calibration instructs the switches [47], [48], [49], [50], and [51] to route the second stage calibrated output of the transmit amplifier [43] as defined above to the receive amplifier [40]. The receive gain control [41] is instructed to set the gain of the receive amplifier [40] to calibration specifications.

Calibration is complete when all three stages have been performed.

In normal operation, the user of the device would connect the apparatus to a telephone circuit via an RJ11 or RJ45 patch cord. The user would then select the type of test to perform.

A 'typical' test on a telephone company Central Office (CO) line would be to select a PWM sweep using frequencies from 10 Kilohertz through 25 Megahertz. This scan will create distinct standing waves for every reflection point between 0 and 36,000 feet from the source of the test where a change in impedance occurs due to a punch-down, bridge tap junction, endpoint, discontinuity, short, or ground fault.

The mechanics of programming DSPs to perform the functions required to implement the invention are well described in the literature and are well known to those of skill in the art, and as such will not be described herein.

The general operation of the circuitry on the probe board [14] is as follows:

The waveform synthesizer [44] of the DSP [30] is directed by software program instructions provided to the DSP by the system processor in response to operator instructions to define the waveform (pulse, sine, complex sinusoidal, saw, triangle) desired to perform a test.

The frequency synthesizer [45] of the probe processor [20] is then directed by software program instructions in the DSP to cause the waveforms that are programmed and generated by the waveform synthesizer [44] to be transmitted at the specified frequency. The output waveform from the waveform synthesizer [44] is sent into the transmit amplifier [43]. The transmit gain, controlled by the transmit gain control [42], is fixed for the duration of a run.

The transmit amplifier [43] is a high precision push-pull style amplifier that will inject the waveform directly into the circuit under test.

The primary receive source select switch [49] is instructed to tie the receive amplifier [40] in parallel with the transmit amplifier [43]. The receive amplifier is a high-precision 3-stage op-amp amplifier, meaning that the amplifier will provide a precise, fixed gain to the combined stimulus/reflection signals.

Prior to being injected into a circuit to be tested, the signal is passed through a delay loop, introducing a time delay such that the first major resonance point occurs at the end of the delay loop when the frequency is approximately 25 mHz. Thus introducing a minimum delay simplifies the circuit design, especially as necessary to characterize points at which the impedance changes very near to the test instrument. Provision of the delay loop also simplifies the design of the transmitter circuitry, since overall lower frequency signals are satisfactory; thus avoiding higher-frequency signals minimizes signal attenuation, which increases at higher frequencies.

While the stimulating waveforms are being transmitted, the receive amplifier [43] is receiving and amplifying the resultant transmit signal combined with incoming reflections. The circuit under test normally attenuates a significant amount of the power of the transmit signal and this attenuation is detectable immediately at the transmission source.

The receive amplifier [40] incorporates protective circuitry so that a sudden power surge, such as ringer current, does not damage the DSP's RMS read ports [34] and peak-peak read ports [35].

As waveforms at each frequency are transmitted into the circuit under test, the DSP delays long enough for the receive amplifier [40] and the DSP's receiver ports [34] and [35] to stabilize. The RMS and peak-peak values are then calculated by software in the DSP. That is, the frequency sweep is not continuous, but occurs stepwise; in a typical sweep of in-building wiring where the maximum circuit runs are expected to be 3000 feet, frequencies from 120 kilohertz, representing the distance of approximately 3000 feet to 74.5 megahertz, representing a distance of approximately 5 feet, are employed. The frequency at each step would be set to detect standing waves at distances of 5, 6, 7, . . . 99, 100, 110, 120, . . . ,3000 feet from the test location, for a total of 395 test frequencies. Each test frequency would be active for approximately 100 ms each, so that the total sweep takes 39.5 seconds. Standing wave detection for distances shorter than 5 feet does not have any practical value.

Once a reading has been taken, the results of that reading (frequency, RMS, peak-peak) and the condition of the various components (gain, signal routing) are sent to the system processor [21] via the serial interface. The frequency synthesizer [45] is then instructed to change its frequency to the next frequency step. The process of transmitting, waiting, reading and sending to the system processor continues until the frequencies specified for a test have all been exercised.

Before any tests are performed, however, the overall system needs to identify if the telephone line under test that is connected through the telephony interface [5] is carrying a digital carrier signal.

This is because pulse, sawtooth and certain complex sinusoidal waveforms which are shaped similar to pulse waveforms (pulse-style waveforms) are readily detected by digital telephony receivers like those in the Definity telephones and switch from Lucent, Inc. and the ComDial digital telephone system. These digital telephone interfaces attempt to interpret pulse-style waveforms as part of their own digital carriers. The encoding of each system's digital pulses form a protocol whereby components (telephone switch, telephone) on either side of the circuit communicate with each other. The protocols are numerous and are defined by telephone industry standards like A-LAW, which are well known to practitioners of the art and are not herein described.

When interrupted by pulse-style waveforms as described above, the digital telephony interfaces lose synchronization with each other and cause the circuit to be taken out of service. Pulse-style waveforms of sufficient amplitude to resemble the data pulses sent by the digital telephone equipment in normal use therefore must not be transmitted into these types of systems.

Therefore, if pulse waveforms are initially detected on the circuit (indicating the presence of digital telephony signals), the system processor will avoid attempting to characterize a digital circuit with one of the defined pulse-style waveforms used according to the invention to characterize analog telephone circuits. Instead, a simple sinusoidal waveform signal will be transmitted; alternatively, a pulse waveform of significantly lower amplitude (e.g., an order of magnitude) than the pulses transmitted by the digital telephone equipment in normal use can be employed. More specifically, since various digital telephone systems have differing minimum pulse heights, it is not satisfactory to simply specify a minimum amplitude for the "probe" pulses transmitted according to the invention. Alternatively, the probe pulses can be discriminated from the "normal" pulses on a digital line by employing probe pulses of a higher frequency than the normal pulse, at some cost in complexity of the pulse generation and receiving circuits.

Referring again to FIG. 2, during a sweep, the system processor [21] receives sets of data from the DSP [30] defining the signal being transmitted, including the frequency, whether RMS or peak-to-peak voltage is being measured, the value of the RMS or peak-to-peak voltage, the duration of the test, and the conditions of the signal routing switches. Whether RMS peak-to-peak voltage is selected depends on the stimulating waveform; pulse-style waveforms are more readily measured with RMS voltage, while sinusoidal waveforms will be more easily determined with peak-to-peak measurements. The system processor [21] stores this information in ram memory [19], converts frequency to distance using formulas described above, then creates and displays the FDR trace described above. The trace is analyzed mathematically by the system processor to (1) remove noise and (2) determine peaks (standing waves).

If the operator has requested that characterization numbers be displayed for the purpose of numerical circuit comparison, each of the standing waves and voltages are reduced to the triplets using techniques described above, and are then concatenated to form the SWOCN, VOCN, then checksummed to form the HoCC and VeCC. Results are then displayed on the system display [2].

As also discussed above, the data indicative of voltage across the circuit under test versus frequency can be plotted and stored as is, or subjected to Fourier transform analysis to reduce it to a series of coefficients of various frequency components present in the data indicative of resonances in the circuit. Programming of the system processor to perform such analysis is well within the skill of the art.

While a preferred embodiment of the invention has been described in detail, those of skill in the art will recognize that numerous further enhancements, improvements, and modifications thereto are possible without departure from the essential scope of the invention, which is therefore not to be limited by the above disclosure.

What is claimed is:

1. A method for characterizing a telephone or other circuit, comprising the steps of:
    transmitting a series of test signals of varying frequency content into the circuit to be characterized;
    measuring the voltage in the circuit at the transmitting location as to each of said test signals of varying frequency content;
    identifying the frequency content(s) of the test signals transmitted into the circuit as to which the measured voltage is maximal;
    determining the distance of points at which the circuit impedance varies as a function of the frequency content(s) of the identified signals as to which the measured voltage is maximal; and
    generating and storing a numerical representation of the frequencies with respect to which the measured voltage is maximal.

2. The method of claim 1, wherein said step of determining the distance of points at which the circuit impedance varies is performed using known information for the propagation velocity of signals within said circuit.

3. The method of claim 1, comprising the further steps of determining whether said circuit is normally used to carry analog or digital signals, and selecting a preferred type of test signals accordingly.

4. The method of claim 3, wherein said step of determining whether said circuit is normally used to carry analog or digital signals is performed by examining the signals on said circuit.

5. The method of claim 3, wherein if said circuit normally carries digital signals, sinusoidal test signals are used to characterize said circuit.

6. The method of claim 3, wherein if said circuit normally carries digital signals, said test signals are pulse-width modulated (PWM) signals having amplitude and/or frequency characteristics substantially differing from the digital signals normally carried by said circuit.

7. The method of claim 1, wherein the frequency of said test signals transmitted into said circuit to be tested is varied step-wise over a range of frequencies.

8. The method of claim 1, wherein the range of frequencies over which said test signals extend is chosen as a function of the approximate overall length of the circuit to be tested.

9. The method of claim 8, wherein said range of frequencies is between about 10 kHz and 2 mHz, where the approximate overall length of said circuit is more than about 200 feet.

10. The method of claim 8, wherein said range of frequencies is between about 2 mHz and 80 mHz, where the approximate overall length of said circuit is less than about 200 feet.

11. The method of claim 1, comprising the further step of passing said test signal through a delay loop before introducing the test signals into the circuit to be tested.

12. The method of claim 1, wherein said step of generating and storing a numerical representation of the frequencies with respect to which the measured voltage is maximal is performed by Fourier transform analysis of data representative of the measured voltage.

13. The method of claim 1, wherein said numerical representation comprises a series of numbers indicative of the distances between the point at which said test signals are transmitted into the circuit to be characterized, and points at which the circuit impedance varies.

14. The method of claim 1, wherein said numerical representation comprises a series of numbers indicative of peak voltages measured corresponding to standing waves on the circuit to be characterized.

15. An instrument for characterizing a telephone or other circuit, comprising:
    means for selecting a type of test signal from a selection thereof;

means for transmitting a series of test signals of said selected type and of varying frequency content into the circuit to be characterized;

means for measuring the voltage in the circuit at the transmitting location as to each of said test signals of varying frequency content;

means for identifying the frequency content(s) of the test signals transmitted into the circuit as to which the measured voltage is maximal;

means for determining the distance of points at which the circuit impedance varies as a function of the identified frequency content(s) of the signals as to which the measured voltage is maximal; and means for generating and storing a signature comprising a numerical representation of the frequencies at which the measured voltage is maximal.

16. The instrument of claim 15, wherein said means for selecting a type of test signal from a selection thereof comprises a waveform synthesizer.

17. The instrument of claim 15, wherein said means for transmitting a series of test signals of said selected type and of varying frequency content into the circuit to be characterized comprises a frequency synthesizer coupled to said waveform synthesizer and a transmit amplifier.

18. The instrument of claim 15, wherein said means for identifying the frequency content(s) of the test signals transmitted into the circuit as to which the measured voltage is maximal comprises a digital signal processor.

19. The instrument of claim 15, wherein said means for identifying the frequency content(s) of the test signals transmitted into the circuit as to which the measured voltage is maximal and said means for determining the distance of points at which the circuit impedance varies as a function of the identified frequency content(s) of the signals as to which the measured voltage is maximal comprise a system processor.

20. The instrument of claim 19, wherein said system processor is further capable of generating a signature comprising a said numerical representation of the frequencies at which the measured voltage is maximal.

21. The instrument of claim 15, wherein said signature is generated by performance of Fourier transform analysis of the measured voltages.

22. The instrument of claim 15, wherein said means for determining the distance of points at which the circuit impedance varies is performed using known information for the propagation velocity of signals within said circuit.

23. The instrument of claim 15, further comprising means for determining whether said circuit is normally used to carry analog or digital signals by examining the signals on said circuit, said means for selecting a type of test signal from a selection thereof being responsive thereto.

24. The instrument of claim 23, wherein if said circuit normally carries digital signals, said means for selecting a type of test signal from a selection thereof selects a series of varying frequency sinusoidal test signals, or a series of pulse-width modulated signals of amplitude and/or frequency content substantially different from the digital signals normally carried by said circuit, to characterize said circuit.

25. The instrument of claim 15, further comprising a delay loop through which said test signals are passed before introduction into a circuit to be tested.

26. The instrument of claim 15, wherein said signature comprises a series of numbers indicative of the distances between the point at which said test signals are transmitted into the circuit to be characterized, and points at which the circuit impedance varies.

27. The instrument of claim 15, wherein said signature comprises a series of numbers indicative of peak voltages measured corresponding to standing waves on the circuit to be characterized.

28. A method for characterizing a telephone or other circuit, comprising the steps of:

determining whether said circuit is normally used to carry analog or digital signals, by examining the signals on said circuit, and selecting a preferred type of test signals responsive thereto;

transmitting a series of test signals of the preferred type and of varying frequency content into the circuit to be characterized;

measuring the voltage in the circuit at the transmitting location as to each of said test signals of varying frequency content;

identifying the frequency content(s) of the test signals transmitted into the circuit as to which the measured voltage is maximal; and determining the distance of points at which the circuit impedance varies as a function of the frequency content(s) of the identified signals as to which the measured voltage is maximal.

29. The method of claim 28, wherein if said circuit normally carries digital signals, sinusoidal test signals are used to characterize said circuit.

30. The method of claim 28, wherein if said circuit normally carries digital signals, said test signals are pulse-width modulated (PWN) signals having amplitude and/or frequency characteristics substantially differing from the digital signals normally carried by said circuit.

31. The method of claim 28, wherein the frequency of said test signals transmitted into said circuit to be tested is varied step-wise over a range of frequencies.

32. The method of claim 28, wherein said step of determining the distance of points at which the circuit impedance varies is performed using known information for the propagation velocity of signals within said circuit.

33. The method of claim 28, wherein the range of frequencies over which said test signals extend is chosen as a function of the approximate overall length of the circuit to be tested.

34. The method of claim 33, wherein said range of frequencies is between about 10 kHz and 2 mHz, where the approximate overall length of said circuit is more than about 200 feet.

35. The method of claim 33, wherein said range of frequencies is between about 2 mHz and 30 mHz, where the approximate overall length of said circuit is less than about 200 feet.

36. The method of claim 28, comprising the further step of passing said test signal through a delay loop before introducing the test signals into the circuit to be tested.

37. The method of claim 28, comprising the further step of generating and storing a numerical representation of the frequencies with respect to which the measured voltage is maximal.

38. The method of claim 37, wherein said step of generating and storing a numerical representation of the frequencies with respect to which the measured voltage is maximal is performed by Fourier transform analysis of data representative of the measured voltage.

39. The method of claim 37, wherein said numerical representation comprises a series of numbers indicative of the distances between the point at which said test signals are transmitted into the circuit to be characterized, and points at which the circuit impedance varies.

40. The method of claim 37, wherein said numerical representation comprises a series of numbers indicative of peak voltages measured corresponding to standing waves on the circuit to be characterized.

41. An instrument for characterizing a telephone or other circuit, comprising:
- means for determining whether said circuit is normally used to carry analog or digital signals by examining the signals on said circuit;
- means responsive to said means for determining whether said circuit is normally used to carry analog or digital signals for selecting a type of test signal from a selection thereof;
- means for transmitting a series of test signals of said selected type and of varying frequency content into the circuit to be characterized;
- means for measuring the voltage in the circuit at the transmitting location as to each of said test signals of varying frequency content;
- means for identifying the frequency content(s) of the test signals transmitted into the circuit as to which the measured voltage is maximal; and
- means for determining the distance of points at which the circuit impedance varies as a function of the identified frequency content(s) of the signals as to which the measured voltage is maximal.

42. The instrument of claim 41, wherein if said circuit normally carries digital signals, said means for selecting a type of test signal from a selection thereof selects a series of varying frequency sinusoidal test signals, or a series of pulse-width modulated signals of amplitude and/or frequency content substantially different from the digital signals normally carried by said circuit, to characterize said circuit.

43. The instrument of claim 41, wherein said means for selecting a type of test signal from a selection thereof comprises a waveform synthesizer.

44. The instrument of claim 41, wherein said means for transmitting a series of test signals of said selected type and of varying frequency content into the circuit to be characterized comprises a frequency synthesizer coupled to said waveform synthesizer and a transmit amplifier.

45. The instrument of claim 41, wherein said means for identifying the frequency content(s) of the test signals transmitted into the circuit as to which the measured voltage is maximal comprises a digital signal processor.

46. The instrument of claim 41, wherein said means for identifying the frequency content(s) of the test signals transmitted into the circuit as to which the measured voltage is maximal and said means for determining the distance of points at which the circuit impedance varies as a function of the identified frequency content(s) of the signals as to which the measured voltage is maximal comprise a system processor.

47. The instrument of claim 46, wherein said system processor is further capable of generating and storing a signature comprising a numerical representation of the frequencies at which the measured voltage is maximal.

48. The instrument of claim 47, wherein said signature is generated by said system processor by performance of Fourier transform analysis of the measured voltages.

49. The instrument of claim 47, wherein said signature comprises a series of numbers indicative of the distances between the point at which said test signals are transmitted into the circuit to be characterized, and points at which the circuit impedance varies.

50. The instrument of claim 47, wherein said signature comprises a series of numbers indicative of peak voltages measured corresponding to standing waves on the circuit to be characterized.

51. The instrument of claim 41, wherein said means for determining the distance of points at which the circuit impedance varies is performed using known information for the propagation velocity of signals within said circuit.

52. The instrument of claim 41, further comprising a delay loop through which said test signals are passed before introduction into a circuit to be tested.

* * * * *